United States Patent

Wilson et al.

[11] Patent Number: 6,101,205
[45] Date of Patent: Aug. 8, 2000

[54] LASER BAR STRUCTURE AND METHOD OF FABRICATION

[75] Inventors: Stewart Wayne Wilson; David Pace Caffey, both of Tucson, Ariz.

[73] Assignee: Opto Power Corporation, Tucson, Ariz.

[21] Appl. No.: 09/052,519

[22] Filed: Mar. 31, 1998

[51] Int. Cl.$^7$ .............................. H01S 3/04; H01S 5/00; H01S 3/082

[52] U.S. Cl. ........................... 372/50; 372/36; 372/45; 372/97

[58] Field of Search ................. 372/50, 45, 36, 372/97

[56] References Cited

U.S. PATENT DOCUMENTS 5,128,951  7/1992  Karpinski .................... 372/50

*Primary Examiner*—Frank G. Font
*Assistant Examiner*—Armando Rodriguez
*Attorney, Agent, or Firm*—Herbert M. Shapiro

[57] ABSTRACT

A plate of metal is bonded to a plate of and electrical insulator and the metal is cut through into a plurality of parallel channels, or recesses, each of a dimension to receive a laser diode (bar). A laser diode is positioned in each of the channels and a solder preform, positioned on the top of the laser diode bars. Is heated to flow around each laser diode bar to secure it in place. A highly manufacturable laser diode assembly having a higher heat capacity results for bonding to a heat sink.

2 Claims, 3 Drawing Sheets

LASER BAR STRUCTURE AND METHOD OF FABRICATION

FIELD OF INVENTION

This invention relates to laser diodes and more particularly to a structure for positioning and receiving a plurality of laser diodes with emitting facets in a plane and evenly spaced.

BACKGROUND OF THE INVENTION

U.S. Pat. No. 5,128,951 issued Jul. 7, 1992 to Karpinski discloses a laser diode positioning structure which employs an electrically insulating plate into which a plurality of recesses are cut. The recesses are evenly spaced and each is cut to a depth to receive a laser diode bar such that the emitting facet is at the top face of a recess. Prior to the placement of laser diodes into the recesses, the recesses are plated with metal and the metal is then removed from the bottom of the recesses. Each diode, after placement, has an electrical contact to opposite faces thereof and those contacts are electrically isolated from one another. Such a process is time consuming and expensive.

An alternative technique is to stack metalized electrically insulated dividers with a spacer between each pair of adjacent dividers and to bond the dividers to a thin electrically insulating plate. The spacers are then removed. Such a technique is also expensive and time consuming.

BRIEF DESCRIPTION OF THE INVENTION

In accordance with the principles of this invention, a thin plate of electrically insulating material is sandwiched and bonded by two thin metal plates and one plate is etched or cut through to provide a plurality of parallel channels or recesses each of a width and depth to (loosely) accommodate a laser diode bar. A laser diode bar is placed in each recess and a solder preform is placed over the etched surface. The solder preform is melted to flow into each recess to secure each laser diode bar in place.

The emitting facet of each of the laser diodes bar is, as a result, located in a single plane and at exactly evenly spaced positions to a tolerance determined by the highly controlled cutting process. Moreover, the resulting structure is relatively tolerant of higher heat excursions because of the presence of a metal plate rather than an electrically insulating material, for positioning the laser diode bars. Since, typically, metals have a higher thermal conductivity than electrically insulating materials.

DETAILED DESCRIPTION OF ILLUSTRATIVE EMBODIMENTS OF THIS INVENTION

Figure 1A:
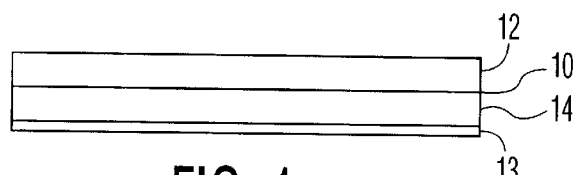
FIGS. 1a, 2a, 3, 4 and 5a are schematic side views of a structured formed during consecutive steps of a method of fabrication in accordance with the principles of this invention.
Figure 1B:
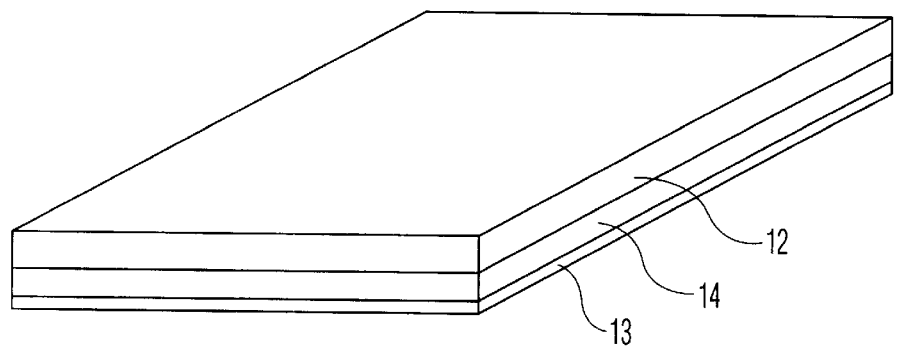
FIGS. 1b, 2b and 5b are associated three dimensional views of the side views of FIGS. 1a, 2a and 5a respectively.

FIG. 1a is a side view of a multi-material structure 10 in accordance with the principle of this invention. FIG. 1b is the associated three dimensional view. The structure includes top and bottom plates 12 and 13 sandwiching a plate 14. Plates 12 and 13 are of an electrically conductive material such as copper and plate 14 is of an electrically insulating material such as Beryllium Oxide. The plates are securely and intimately bonded together by sintering or any other standard bonding technique such as direct diffusion bonding or brazing.

Figure 2A:
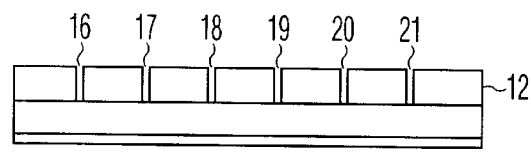
Figure 2B:
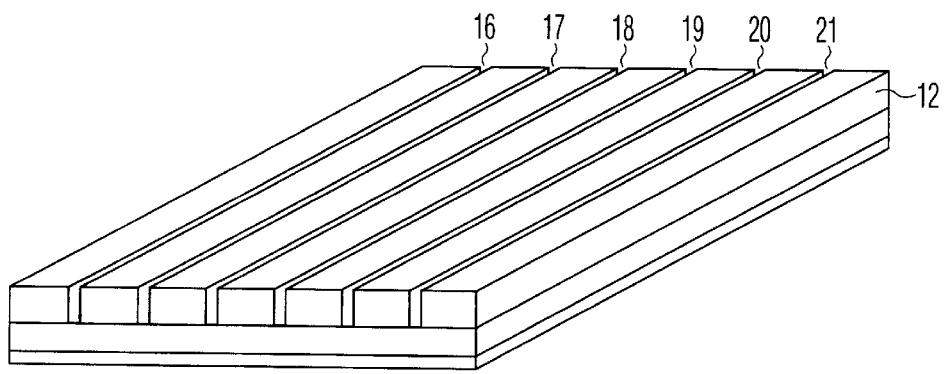
Figure 3:
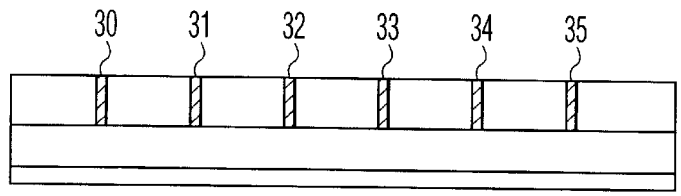
Figure 4:
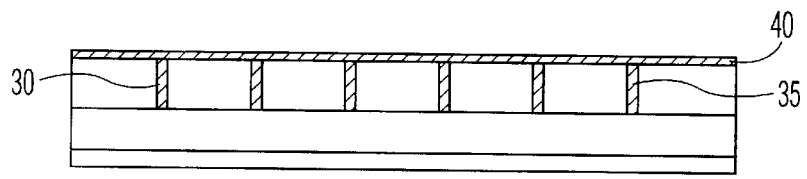
Figure 5A:
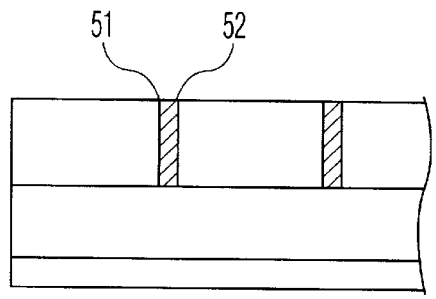
Figure 5B:
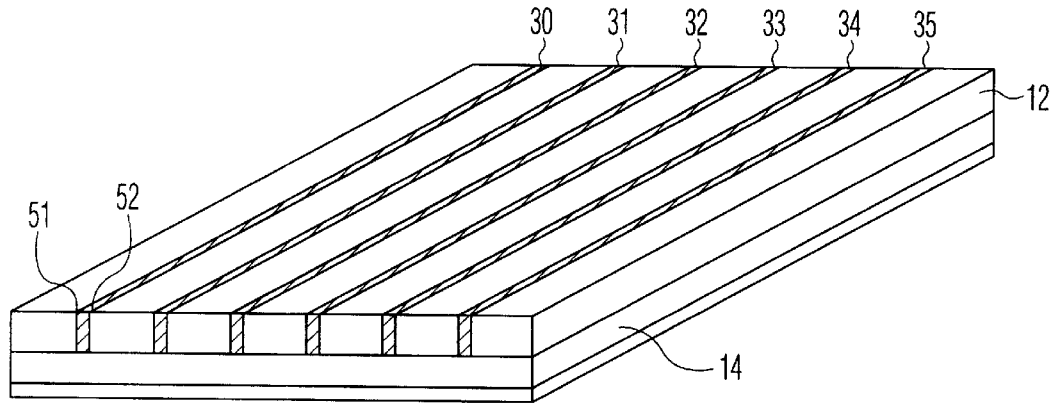

FIG. 2a shows copper plate 12 formed into a plurality of channels 16, 17, 18, 19, 20 and 21. The channels can be seen to penetrate plate 12 exposing the electrically insulating material of plate 14 at the bottom of the channel. Each channel has a depth and width to accommodate a laser diode (bar). FIG. 2b is the associated three dimensional view. FIG. 3 shows laser diode bars 30, 31, 32, 33, 34 and 35 in place in the channels (16, 17, 18, 19, 20, 21) respectively. The channels are sufficiently wide to allow solder to flow around the laser diode (bars) 30–35 when a preform 40 (FIG. 4) is heated to above the melting point of the preform. FIG. 5a shows the completed structure after reflow of the solder and the filling of the solder 40 around the top and bottoms sides of the laser bars 30–35, as indicated at 51 and 52. FIG. 5b is the associated three dimensional view.

Figure 6:
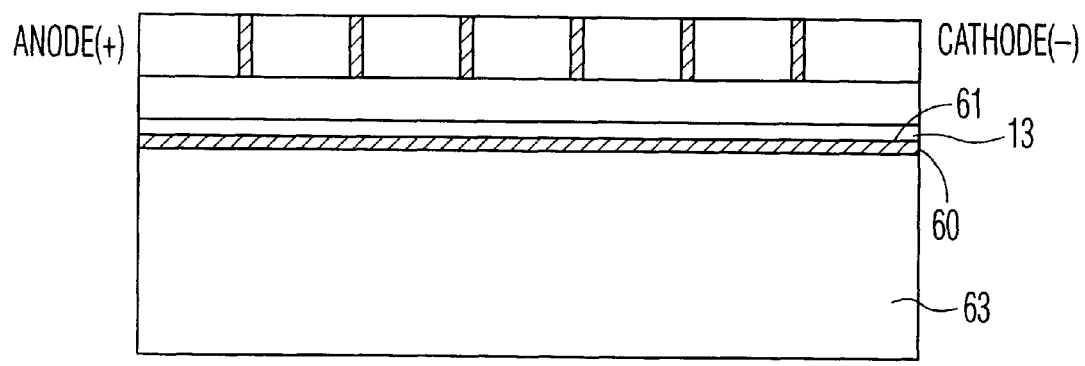
FIG. 6 is a schematic side view of a laser diode structure including a series of laser diode bars in accordance with the principles of this invention produced by the method of FIGS. 1a–5b.

A second solder preform 60 is positioned on the bottom plate surface 61 of the electrically conductive conducting plate 13 as shown in FIG. 6. A heat sink 63 is abutted against solder preform 60 and the solder is heated to melting temperature and then cooled to bond the heat sink to plate 13.

In one specific embodiment, Plates 12 and 13 had dimensions of 394 mils×394 mils×32 mils. Plate 14 had dimensions of 394 mils×394 mils×25 mils. Plates 12 and 13 were of copper and plate 14 was of Beryllium Oxide. Each channel had dimensions of 394 mils×32 mils×6 mils and there were 10 evenly spaced 16 mils apart. The diode bars were of Aluminum, Galium Arsinide material with several emitting facets each. A copper heat sink 394 mils×394 mils×100 mils was attached to the bottom of plate 13 (as viewed).

Electrically insulating material other than Beryllium Oxide can be used as, for example, Aluminum Nitride. It is important though that the electrically insulating material also be highly thermally conductive.

What is claimed is:

1. Apparatus comprising a thin plate of an electrical insulator having first and second planar surfaces in spaced apart parallel planes, a thin plate of electrically conductive material bonded to said first planar surface, said thin plate of electrically conductive material including a plurality of parallel channels formed therethrough, each of said channels having a width and depth to accept a laser diode (bar) said apparatus including a laser diode bar in each of said channels, each of said laser diodes having an emitting facet facing away from said first surface, said apparatus including a layer of solder in each of said channels about the laser diode therein for securing said laser diode in place said apparatus also including a second thin plate of copper bonded to said second surface.

2. Apparatus as in claim 1 also including heat sink bonded to said second thin plate of copper.

* * * * *